United States Patent [19]

Kim et al.

[11] Patent Number: 5,808,355
[45] Date of Patent: Sep. 15, 1998

[54] LEAD FRAME OF A SEMICONDUCTOR DEVICE AND A METHOD FOR DESIGNING IT

[75] Inventors: Yong-yeon Kim; Sung-young Han, both of Kyungki-do, Rep. of Korea

[73] Assignee: Samsung Aerospace Industries, Ltd., Kyeongsanqnam-do, Rep. of Korea

[21] Appl. No.: 658,126

[22] Filed: Jun. 4, 1996

[30] Foreign Application Priority Data

Jun. 5, 1995 [FR] France .................................. 95-14845

[51] Int. Cl.$^6$ ................................................ H01L 23/495
[52] U.S. Cl. .......................... 257/666; 257/669; 257/670
[58] Field of Search .................................. 257/666, 676, 257/669, 670

[56] References Cited

U.S. PATENT DOCUMENTS 5,457,341  10/1995  West ........................................ 257/666

FOREIGN PATENT DOCUMENTS 59-178757  10/1984  Japan .
6-42155   2/1988  Japan .................................. 257/666.3
3-284867  12/1991  Japan .

*Primary Examiner*—Tom Thomas
*Assistant Examiner*—Roy Potter
*Attorney, Agent, or Firm*—Finnegan, Henderson, Farabow, Garrett & Dunner, L.L.P.

[57] ABSTRACT

The present invention relates generally to a lead frame which is bended with a predetermined angle many times in order that a sectional area of a punch to form two lead lines which are located in the center of tie bars is increased, and increase the inertial moment as to a sectional area in making a lead frame of a desired shape. And the above-mentioned lead frame comprises a dambar; inner leads which has a certain angle at the part being below half the distance from lead tips to the above-mentioned dambar, and is connected to the above-mentioned dambar; outer leads which is connected to the above-mentioned dambar, and is populated on a circuit board; and tie bars which support the above-mentioned inner leads in case of taping.

6 Claims, 5 Drawing Sheets

LEAD FRAME OF A SEMICONDUCTOR DEVICE AND A METHOD FOR DESIGNING IT

BACKGROUND OF THE INVENTION

A. Field of the Invention

The present invention relates to a lead frame of a semiconductor device and a method for designing it, especially to a lead frame of a semiconductor designed to be greatly bent in a certain part when designing a lead line located between tie bars and a method for designing it.

B. Description of the Related Art

During the manufacture of a semiconductor chip, a package, in which the chip is built, is created. A lead frame, which is connected to each input/output terminal of the built-in chip, is also created. Each input/output terminal of the built-in chip can be connected to the lead frame external to the semiconductor package by bonding the input/output terminal to an internal lead with a wire.

The lead frame connects the semiconductor chip with a printed circuit board (PCB), and is composed of three parts: a pad in which the semiconductor chip is built, the internal leads which are wire bonded to the semiconductor chip, and external leads which are connected to the PCB.

When manufacturing the semiconductor chip in a plastic or ceramic package, the input/output terminal is connected through wire bonding to the internal lead of the lead frame.

The input/output terminal is connected after one chip is built in the plastic or ceramic package. A molding process, using a low voltage transfer molding method and a high purity epoxy resin, is subsequently performed. The external lead is cut according to a lead shape to be built into a socket or the board of the package of the integrated circuit.

When an integrated circuit package is created according to the aforementioned processes, several leads are formed between the tie bars. The tie bars support and are extension line of the pad.

As chip design becomes more intricate through the development of semiconductor manufacturing techniques, the number of pins needed for each input/output terminal increases. When the internal leads are formed by a stamped lead frame (SLF) method, which requires several pins in a limited amount of space, the width of the lead itself is exceedingly narrowed. Since the shape of the lead of the lead frame is identical to the shape of the space formed between each lead, the space between each lead is also narrowed.

Thus, the width of the punch required to form the leads is correspondingly narrowed.

When leads are formed by compressing the punch on the lead frame board with a fixed pressure, the inertial moment exerted against the lead frame by a section of the punch is frequently insufficient to properly punch the leads. In such instances, the leads become bent or twisted.

As shown in FIG. 1, the internal leads 10 in between two tie bars 1 are generally shaped in a straight line from the lead tips 2 to the half lengths 3 of the internal leads 10. Thus, the punch used to form these internal leads 10 is also shaped in straight line from the lead. tips 2 to the half lengths 3 of the internal leads 10. Like the above, the part from the lead tips 2 to the half lengths 3 is shaped in straight line, but there is a case that the part of more half lengths is shaped to be bended with certain angle. But, because the inertial moment exerted by the punch is variable according to the shape of the cross-section of the punch, though the width of the cross-section of the punch is the same along its entire length, the inertial moment exerted by the punch is reduced when the shape of the cross-section of the punch is formed in a straight line. Therefore, the internal leads 10 formed by the punch having a straight cross-section may be destroyed or incorrectly formed.

SUMMARY OF THE INVENTION

An object of he present invention is to solve the above mentioned problems in the prior art. More particularly, the object of present invention is to provide a lead frame of a semiconductor and a method for designing it for increasing the moment of inertia as to a sectional area of a (punch) and a lead frame and improving its hardness by designing a lead line located between tie bars of a lead frame to be greatly bent in a certain part.

The structure of the present invention to achieve the above-mentioned object comprises a damber; a inner lead part which has a bent part of a certain angle in a part which is below half the distance from a lead tip to the above-mentioned damber and an inner lead part connected with the above-mentioned damber; an outer lead part which is connected with the above-mentioned dambar and populated on a circuit board; and tie bars which support the above-mentioned inner lead part in case of taping.

Another structure of the present invention to achieve the above-mentioned object comprises a damber; an inner lead part which is shaped in a certain wave pattern at a part which is below half the distance from a lead tip to the above-mentioned damber and is connected with the above-mentioned damber; an outer lead part which is connected with the above-mentioned damber and is populated on a circuit board; and tie bars which support the above-mentioned inner lead part in case of taping And another structure of the present invention to achieve the above-mentioned object comprises a damber; an inner lead part which varies in width to form a shape with an uneveness pattern and which is connected with the above mentioned dambar; an outer lead part which is connected with the above-mentioned dambar and populated on a circuit board; and tie bars which support the above-mentioned inner lead part in case of taping.

A method for designing a lead frame to achieve the above-mentioned object comprises a step which makes a stipulated shape comprising a pad part, an inner lead part, and an outer lead part by utilizing a plurality of punches which have a bend part of a certain angle at the part being below half the distance from a lead tap to the above-mentioned dambar and a press; a step which coats a pointed part having a stipulated shape with gold, silver and so on; and a step which makes a lead frame by cutting a goods of a reel state with a fixed length and pressing a pad part with a stipulated standard.

A second method for designing a lead frame to achieve the above-mentioned object comprises a step which makes a stipulated shape comprising a pad part, an inner lead part, and an outer lead part in an original material by utilizing a plurality of punches which is formed in a shape of a wave pattern at the part being below half the distance from a lead tip to the above-mentioned dambar and a press; a step which coats a pointed part of a stipulated shape with gold, silver and so on; and a step which forms a lead frame by cutting a goods of a reel state with a fixed length and pressing a pad part with a stipulated standard.

A third method for designing a lead frame to achieve the above-mentioned object comprises a step which forms stipulated shape comprising a pad part, an inner lead part, and an outer lead part by utilizing a plurality of punches whose two sides is shaped in an uneveness pattern at the part being below half the distance from a lead tip to the above-mentioned dambar and a press; a step which coats a pointed part of a stipulated shape with gold, silver and so on; and a step which forms a lead frame by cutting a goods of a reel state with a fixed length and pressing a pad part with a stipulated standard.

DESCRIPTION OF THE PREFERRED EMBODIMENT

Reference will now be made in detail to the present preferred embodiment of the invention, an example of which is illustrated in the accompanying drawings.

Figure 1:
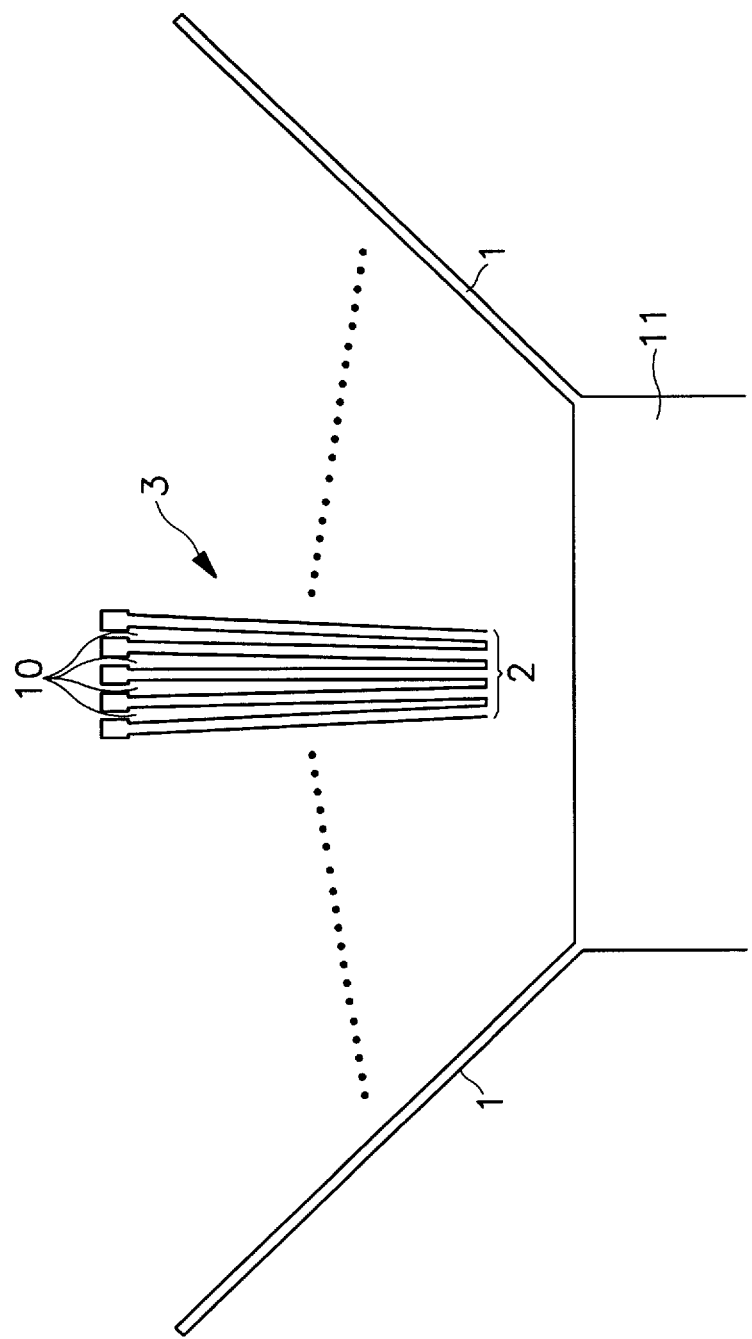
FIG. 1 is a plan view which shows the shape of the internal leads, in between the tie bars, of a conventional lead frame.
Figure 2:
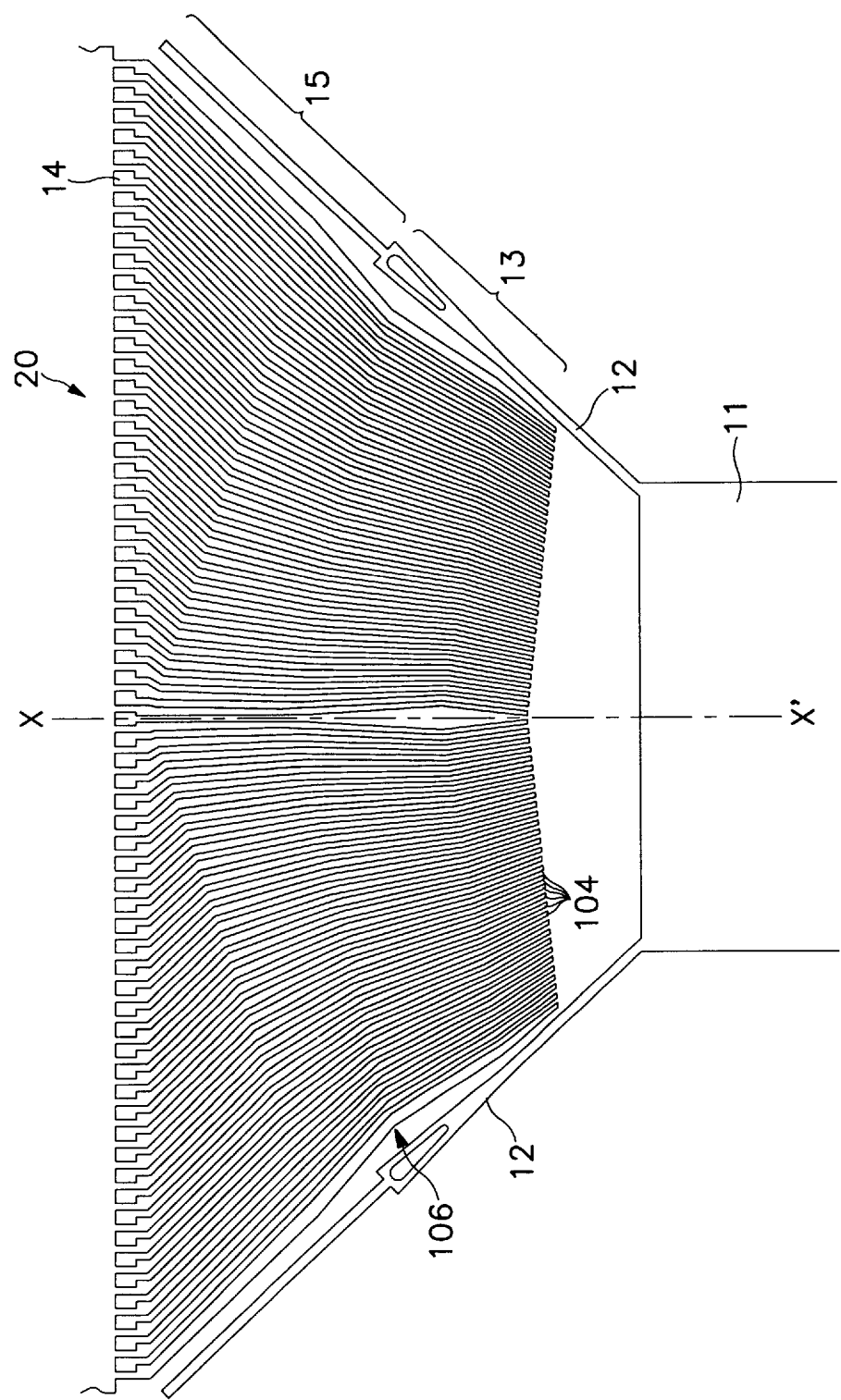
FIG. 2 is a plan view which shows the lead frame according to the preferred embodiment of the present invention.

In accordance with the invention, as shown in FIG. 2, the lead frame 20 comprises: a pad 11 in which the semiconductor chip is built; tie bars 12 which support and are connected to the pad 11; internal leads 13 with which the semiconductor chip (not shown) is bonded to by a wire (not shown); external leads 14 connected to a PCB (not shown); and dambars 15 which connect the internal leads 13 to respective external leads 14.

Figure 9:
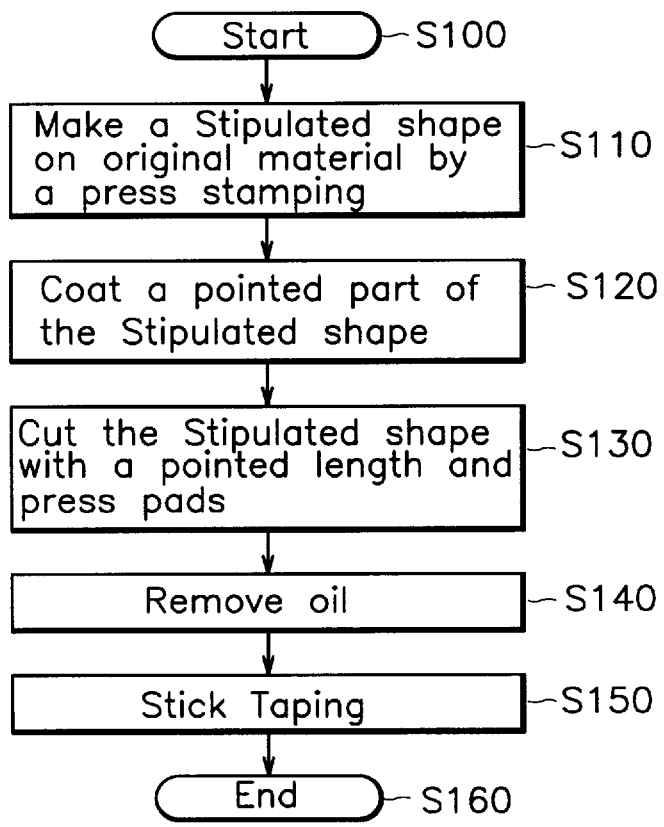
FIG. 9 is a flow chart which shows a method for designing a lead frame according to the preferred embodiment of the present invention.

As illustrated in FIG. 9, a method for designing the above-mentioned lead frame comprises: a step S110 which forms a mold of a lead frame like the above on original material by utilizing a punch and a press; a step S120 which coats the pointed part of a mold with gold, silver and so on; a step S130 which cuts a goods of a reel state with a fixed length and press a pad with a stipulated standard; a step S140 which removes oil covering goods; and a step S150 which bonds tape.

The object of the present invention, in a step which forms the lead frame like the above according to a press tab, is to increase the hardness as to a bend stress or a buckling load accordingly as the moment of inertia of the punch increases by forming the cross-sectional area of some part of the punch which forms a lead line in both sides around a middle line X–X' among a plurality of lead lines formed between tie bars 12.

Generally, the moment of inertia is an index showing a shape of a plane diagram. For example, when it is suggested that a minute area of a plane diagram is dA and the distances from a minute area dA to the X axis and the Y axis are respectively x and y, the moment of inertia of a minute area is the multiplication of a minute area dA and the value that x and y are multiplied, and the drawing moment of inertia is the summing-up about the whole area A of a diagram.

Formulas of a second drawing moment are as follows.

$$Ix = \int A\, y^2\, dA \qquad \text{FOR. 1}$$

$$Ix = \int A\, y^2\, dA \qquad \text{FOR. 2}$$

The moment of inertia calculated like the above is inversely proportional to a bending stress and is proportional to a buckling. In another word, when a load P is added to a bar laid horizontally, a bending stress($\sigma$) occuring in a bar is proportional to the moment of inertia of the section of a bar. And the formula about the above-mentioned relation is as follows.

$$\sigma \alpha 1/I \qquad \text{FOR. 3}$$

Therefore, because the larger the moment of inertia of a cross-section of a bar is, the smaller a bending stress becomes, when the same load(P) is added to a bar. As a result, the larger the moment of inertia is, the enduring force of a barenomenon that a bar is bended when a load being equal to the axis direction is added to a bar laid horizontally. A force(K) which causes the above-mentioned buckling is proportional to the moment of inertia. A formula about the above-mentioned raletion is as follows.

$$K \alpha I/L^2 \qquad \text{FOR. 4}$$

Like the above, the force(K) which causes a buckling is proportional to the moment of inertia. So the larger the moment of inertia is, the larger force (K) is needed to cause buckling.

Figure 3:
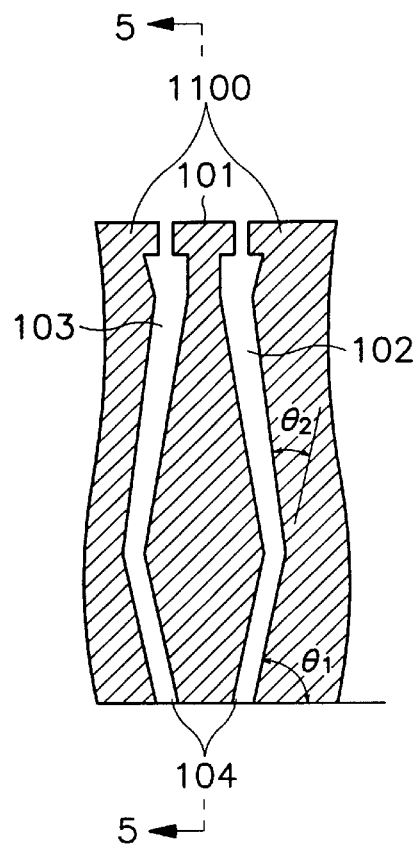
FIG. 3 is a plan view which shows a state of the punch according to the preferred embodiment of the present invention.

Therefore, the possibility that buckling occurs is decreased when the moment of inertia of a cross-section of a bar is large. In order to increase the hardness about a bending and a buckling of a punch for forming a lead line by increasing the moment of inertia like the above, a shape of a punch for making a lead line to the corresponding shape in both sides around the middle line (X–X') among a plurality of lead lines which is formed between tie bars 12 must be made as illustrated in FIG. 3.

The punch 101 may be bent at a fixed angle $\theta 1$ and angle $\theta 2$ at the part being below half the distance from a lead tips to the above-mentioned dambar 15, so that the lead forms the shape of a polygon.

Figure 4:
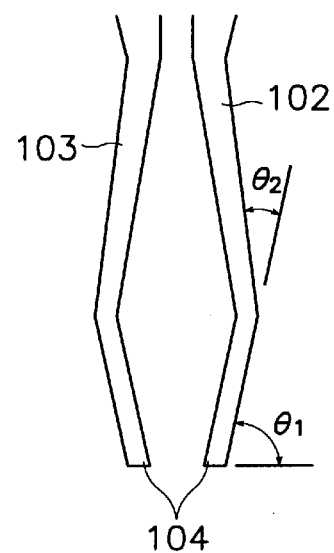
FIG. 4 is a plan view which shows the bend state of the leads according to the preferred embodiment of the present invention.

Thus, the cross-sectional area of the punch 101, between the lead tips 104 (which are near the pad 11) and the half length 106 of the lead, is increased. When a press adult form is performed by the above-mentioned punch 101, the leads 102, 103 formed on both sides of center line X–X' are each shaped like a winding, as shown in FIG. 4.

Figure 5A:
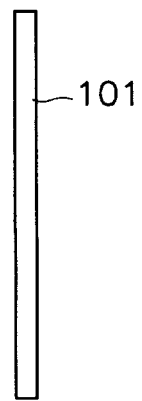
FIGS. 5(a) and (b) are sectional views of the punch.
Figure 5B:
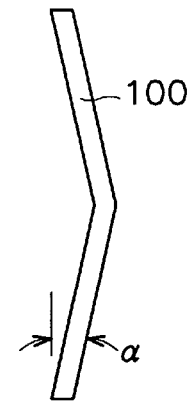

As illustrated in FIG. 5A, when the section of the punch 100 is formed at a straight line, the moment of inertia of the y axis calculated according to the above-mentioned FOR. 2 is about $4.1667\ e^{4-}mm^4$, and as illustrated in FIG. 5B in accordance with the preferred embodiment of the present invention, the moment of inertia calculated when the section of the punch 101 is made to be bent at about five degrees is about $9.1396^{-4}\ mm^4$.

Like the above, when the punch is bent at a fixed angle and its cross-sectional area is increased, the moment of inertia is calculated to be about two times the value of when the punch is formed at a straight pattern. So the hardness of the bent punch 100 is increased because the inertial moment of the bent punch 100 is increased twofold over the inertial moment of the straight punch 101. The inertial moment of a punch is increased in proportion to the ratio of the length of the punch to the width of its cross-section. Thus, since the width of the cross-section of the bent punch 100 is decreased, its inertial moment is increased.

Figure 6:
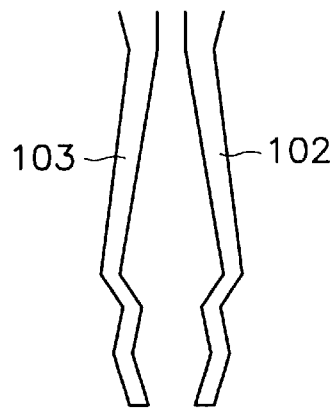
FIG. 6 is a plain view which shows a bending state of a lead according to another preferred embodiment of the present invention.
Figure 7:
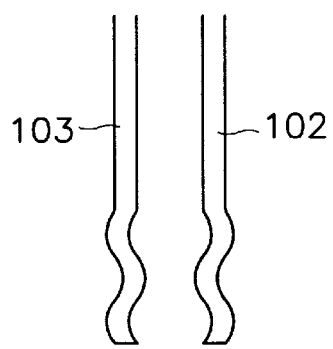
FIG. 7 is a plane view which shows a bend state of a lead according to a second preferred embodiment of the present invention.

Unlike the above-mentioned preferred embodiment, in order to increase the cross-sectional area of the punch as illustrated in FIG.6, the part being below half the distance from lead tips to the above-mentioned dambar 15 of the punch must be bent at a fixed angle many times.

When some part of the punch is bent many times, the cross-sectional area of the punch is larger than when the part of the punch is bent only once. So the hardness of the punch can be greatly improved.

And when some part of the punch 101 is not bent at a fixed angle like the above, but the part of it 101 is formed in a wave pattern, so to speak, an uneveness pattern toward one direction, the cross-sectional area of the punch can be larger than when the punch is formed in a straight pattern.

Figure 8:
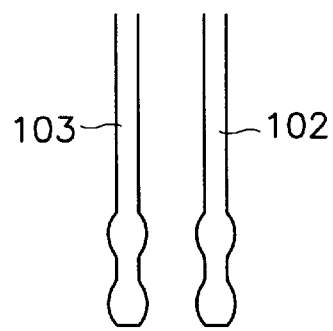
FIG. 8 is a plane view which shows a bend state of a lead according to a third preferred embodiment of the present invention.

In addition, as illustrated in FIG. 8, when some part of the punch 101 is formed to have an uneveness pattern toward both sides such that the width of the inner lead varies, the sectional area of the punch can be increased.

The above-mentioned plurality of the preferred embodiments shows that the cross-sectional area of only some part of the punch 101 is increased. But the shape of the punch can be formed in order that the whole sectional area of the punch is increased within the range of the present invention. And it is also possible to form the punch which is not a straight line pattern but has the thickness difference at each part.

In addition, by applying the above-mentioned process not only to lead lines at the center line X–X' among tie bars but also to all of inner leads 13, the hardness of the punch whose inner part is narrowed in width can be increased.

S110–S140 show the charts which form a lead frame of a stipulated shape by utilizing the above-mentioned punch and performing a press adult form of original material; coat a pointed part of the lead frame with gold, silver and so on; cut the goods of a reel state with a fixed length; press a pad with a stipulated standard; and remove oil covering the goods.

Next, S150 shows a chart which sticks isolation tapes of a fixed shape to the inner leads of a lead frame in order to minimize the transformation of a lead frame.

At this time, the above-mentioned tie bars 12 support the inner leads 13.

The lead frame finished like the above goes through an examination process identifying whether its external appearance is normal or not by the naked eye, and becomes a manufactured good through the process of packaging.

By changing a cross-sectional area of the punch for forming a lead frame in accordance with the preferred embodiment of the present invention like the above-mentioned, the hardness about a bending stress or a buckling can be improved according to the increase of the inertial moment of the punch.

And when a lead frame is formed by a punch whose inertial moment is increased, an elasticity of a lead frame can be increased and the resistance about a shape change can be increased.

And the stickness can be improved accordingly as the area of the lead frame increases in case of taping, and the fixation force of a lead can be increased in case of dambar cutting or the process of an outer lead adult forming.

In addition, a lead frame of a semiconductor which can increase heat discharge efficiency according to the increase of the surface area of a lead when a hypo pin or heat sink is installed, and a method for designing it can be provided.

What is claimed is:

1. A lead frame, comprising:

inner leads having lead tips at a first end thereof;

outer leads populated on a circuit board;

a plurality of dambars connected to and located between said inner leads and said outer leads;

each inner lead having a bent portion between lead tip and dambar and located less than half of the distance between lead tip and dambar from said lead tip, wherein inner leads adjacent and on opposite sides of a center line of the lead frame are bent in opposite directions; and a plurality of tie bars supporting said inner leads.

2. The lead frame of claim 1, wherein the inner leads are bent such that a polygonal space is formed between them.

3. The lead frame of claim 1, wherein the inner leads are bent at an angle not less than five degrees.

4. A lead frame, comprising:

inner leads having lead tips at a first end thereof;

outer leads populated on a circuit board;

dambars connected to and located between said inner leads and said outer leads;

each inner lead having two bent portions between lead tip and dambar, wherein inner leads adjacent and on opposite sides of a center line of the lead frame are bent in opposite directions; and tie bars supporting said inner leads.

5. The lead frame of claim 4, wherein the inner leads are formed in a wave pattern.

6. The lead frame of claim 4, wherein the bent portions of the inner leads are located less than half of the distance between said lead tips and said dambars from said lead tips.

* * * * *